(12) United States Patent
Jung

(10) Patent No.: US 7,776,515 B2
(45) Date of Patent: Aug. 17, 2010

(54) METHOD FOR FORMING A PATTERN ON A SEMICONDUCTOR DEVICE USING AN ORGANIC HARD MASK

(75) Inventor: Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/730,163

(22) Filed: Mar. 23, 2010

(65) Prior Publication Data

US 2010/0176492 A1 Jul. 15, 2010

Related U.S. Application Data

(62) Division of application No. 11/296,758, filed on Dec. 7, 2005, now Pat. No. 7,737,227.

(30) Foreign Application Priority Data

Feb. 23, 2005 (KR) .................. 10-2005-0014889

(51) Int. Cl.
*G03F 7/30* (2006.01)
(52) U.S. Cl. .................. 430/312; 430/18; 430/313; 430/316; 430/317; 430/330
(58) Field of Classification Search .................. 430/18, 430/312, 313, 316, 317, 330
See application file for complete search history.

(56) References Cited

U.S. PATENT DOCUMENTS

| 3,900,662 | A | 8/1975 | Yuan |
| 5,756,255 | A | 5/1998 | Sato et al. |
| 5,885,343 | A | 3/1999 | Cernigliaro et al. |
| 6,593,043 | B2 | 7/2003 | Suwa et al. |
| 6,933,087 | B2 | 8/2005 | Suwa et al. |
| 7,129,011 | B2 | 10/2006 | Rushkin et al. |

OTHER PUBLICATIONS

Prince, "Semiconductor Memories," $2^{nd}$ E., Wiley, pp. 9, 90-91 (1991).
Korean Intellectual Property Office Notice of Rejection, for Korean Patent Application No. 10-2005-0014889, dated Nov. 16, 2006.

*Primary Examiner*—John S Chu
(74) *Attorney, Agent, or Firm*—Marshall, Gerstein & Borun LLP

(57) ABSTRACT

A composition for the organic hard mask includes a polyamic acid compound, and a method for forming a pattern is used in a manufacturing process of semiconductor devices by coating the composition for organic hard mask film on an underlying layer, and depositing a second hard mask film with a silicon nitride SiON film thereon to form a double hard mask film having an excellent etching selectivity, thereby obtaining a uniform pattern.

10 Claims, 5 Drawing Sheets

METHOD FOR FORMING A PATTERN ON A SEMICONDUCTOR DEVICE USING AN ORGANIC HARD MASK

CROSS REFERENCE TO RELATED APPLICATION

This is a division of U.S. patent application Ser. No. 11/296,758 filed Dec. 7, 2005, which claims priority benefit under 35 U.S.C. §119 of Korean Patent Application No. 10-2005-0014889, filed Feb. 23, 2005, the entire respective disclosures of which are incorporated herein by reference.

BACKGROUND OF THE DISCLOSURE

1. Field of the Disclosure

The disclosure relates to a composition for an organic hard mask and a method for forming a pattern of a semiconductor device using the same. More specifically, the disclosure relates to a composition for a organic hard mask containing a polyamic acid compound on an underlying layer and to a method for forming a pattern used in a manufacturing process of all semiconductor devices by coating a organic hard mask film, and depositing a second hard mask film with a silicon nitride (SiON) film thereon to form a double hard mask film having excellent etching selectivity, when a uniform photoresist pattern is formed.

2. Description of the Related Technology

Due to development in the manufacturing technology of semiconductor devices and expansion of application fields of memory devices, a method for manufacturing a high capacity memory device having a highly developed degree of integration has been required. A lithography process has been widely used in a line pattern formation process for gate and bit line or a contact hole pattern formation process for bit line contact.

The lithography process has been improved to form a critical dimension (CD) below 0.07μ with a light source of short wavelength such as deep ultra violet (DUV) rays of chemical amplification instead of a light source of long wavelength such as I-line or KrF (248 nm).

Meanwhile, it is necessary to improve chemically amplified photoresist having high resolution to ArF (193 nm) or VUV (157 nm) as DUV light sources in the lithography process.

Since a chemically amplified photoresist has a lower etch resistance to etching gases than that of underlying layers (such as metal layers, for example) it is impossible to obtain a stable etching selectivity when a photoresist film is formed at 100 nm and less on the underlying layer to form a metal pattern of high integration. As a result, it is difficult to form a uniform pattern.

In order to form a uniform pattern, an organic film using amorphous carbon and an inorganic film using SiON are formed between an underlying layer and a photoresist film, and then an etching process is performed with the films as a hard mask film. Since the amorphous carbon has a physical property like organic materials but is not changed at high temperature of 400° C., the inorganic film can be stably formed thereon. The hard mask film is easily removed after the etching process.

FIGS. 1a through 1c illustrate a conventional method for forming a pattern by using amorphous carbon.

Referring to FIG. 1a, an amorphous carbon layer 3, a SiON film 5, a bottom anti-reflection film 7 and a photoresist film 9 are sequentially formed on an underlying layer 1.

The amorphous carbon layer is formed at a thickness ranging from 200 nm to 700 nm by a CDD method, and the SiON film is formed at a thickness ranging from 30 nm to 100 nm with carbon CVD equipment (produced by AMAT Co.).

A lithography process is performed on the photoresist film 9 to form a photoresist pattern 9-1. Then, an etching process is performed on the amorphous carbon layer 3, the SiON film 5, and the antireflection film 7 with the photoresist pattern 9-1 as an etching mask to obtain a deposition pattern comprising an amorphous carbon layer pattern 3-1, a SiON film pattern 5-1 and an antireflection film pattern 7-1 as shown in FIG. 1b.

Thereafter, the underlying layer 1 is etched with the deposition pattern of FIG. 1b as an etching mask, and developed to obtain an underlying layer pattern 1-1 as shown in FIG. 1c.

However, in the above-described process, additional deposition equipment and new amorphous carbon gas materials are required to form the amorphous carbon layer 3. As a result, the process cost is increased, and the process step becomes complicated.

SUMMARY OF THE DISCLOSURE

The disclosure provides a composition for hard mask to form a uniform pattern which may overcome the above-described problems without use of expensive equipment.

More specifically, the disclosure provides a composition for a hard mask for forming a double hard mask film having excellent etching selectivity in a process for forming an underlying layer pattern.

Also, disclosed herein is a method for forming a pattern of a semiconductor device to obtain a uniform pattern using the same.

BRIEF DESCRIPTION OF THE DRAWINGS

For a more complete understanding of the disclosure, reference should be made to the following detailed description and accompanying drawings.

DETAILED DESCRIPTION OF THE PRESENTLY PREFERRED EMBODIMENTS

Figure 1A:
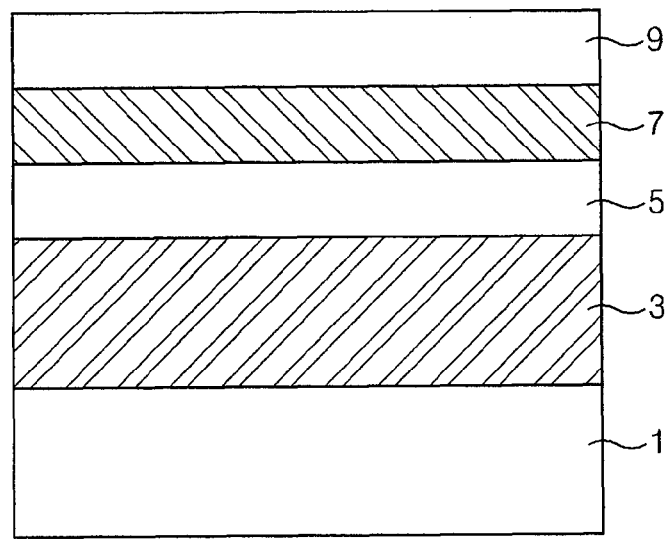
FIGS. 1a through 1c are cross-sectional diagrams illustrating a conventional method for forming a pattern of a semiconductor device.
Figure 1B:
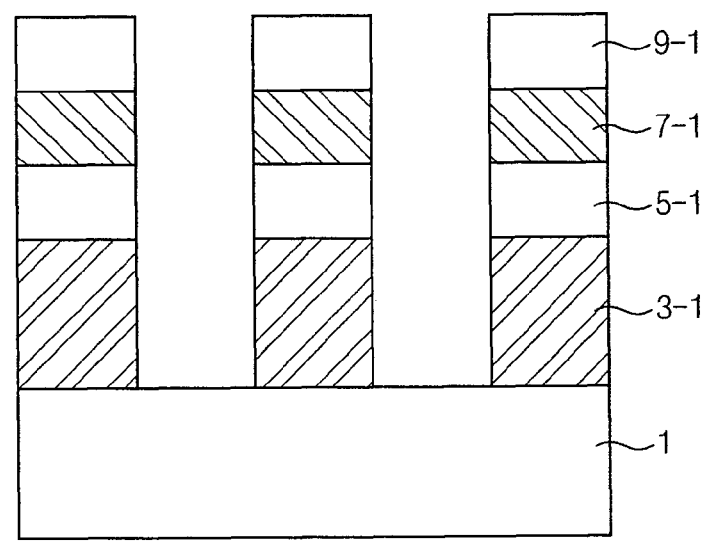
Figure 1C:
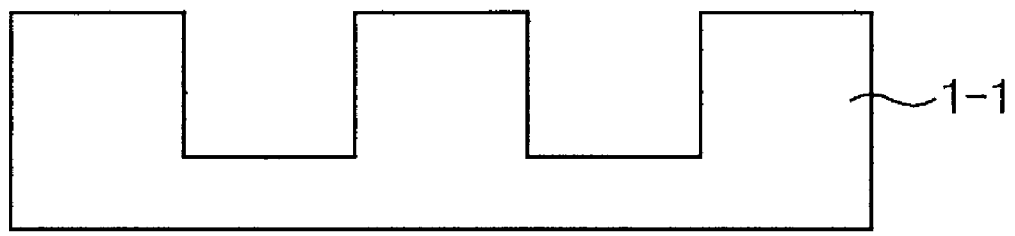

A composition for an organic hard mask includes (i) a polyamic acid compound represented by the Formula 1, (ii) a melamine derivative and (iii) an organic solvent.

[Formula 1]

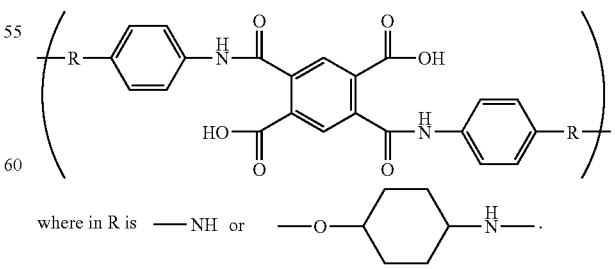

The (i) polyamic acid compound is obtained by reacting 1,2,4,5-benzenetetracarboxylic dianhydride of Formula 2 and an amine compound with a combining equivalent weight ratio of 1:1 at room temperature.

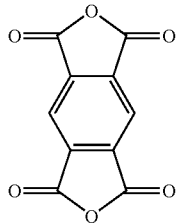

[Formula 2]

The amine compound to improve solubility and coating characteristics of a hard mask film is 1,4-phenylenediamine of the Formula 3 or 4,4'-oxydianiline of the Formula 4.

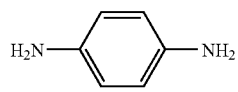

[Formula 3]

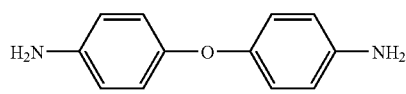

[Formula 4]

The melamine derivative is formed by cross-linkage with a carboxyl group of the polyamic acid compound in a baking process on the disclosed composition for organic hard mask. As result, the hard mask film is not soluble in a developing solution. The melamine derivative is not specifically limited but preferably is represented by 2,4,6-tris(dimethoxymethylamino)-1,3,5-triazine of Formula 5.

[Formula 5]

The melamine derivative is preferably present in an amount ranging from 1 to 5 parts by weight, preferably 3 parts by weight based on 100 parts by weight of the polyamic acid compound. The hard mask film is dissolved in the developing solution during a subsequent developing process when the melamine compound is present in the amount of less than one part by weight, and there is little difference in effect when the melamine compound is present in the amount of more than 5 parts by weight, and thus is not economical to use in that amount.

The organic solvent is not specifically limited to dissolve the above compounds, but preferably is selected from the group consisting of dimethylformamide, 1-methyl-2-pyrrolidone, dimethylacetamide and mixtures thereof.

The organic solvent is preferably present in an amount ranging from 300 to 2000 parts by weight based on 100 parts by weight of the mixture of the polyamic acid compound and the melamine derivative. It is impossible to obtain a hard mask film having a sufficient thickness when the organic solvent is present in the amount of more than 2000 parts by weight, and it is difficult to etch the pattern vertically because the hard mask film is thickly formed when the organic solvent is present in the amount of less than 300 parts by weight.

The disclosed composition for organic hard mask which contains the polyamic acid compound and the melamine derivative has strong heat resistance, and is easily treated to form the film with general equipment used when a photoresist film is formed.

The disclosed composition for organic hard mask is preferably spin-coated on an underlying layer to form a first hard mask film, and a second hard mask film is deposited with a SiON film thereon to obtain a double hard mask film having a high etching selectivity. As a result, a uniform pattern is formed and process cost and process steps can be reduced in comparison with a conventional method.

Also, there is provided a method for forming a pattern of a semiconductor device. The method includes the steps of:

(a) forming an underlying layer on a semiconductor substrate;

(b) forming an first organic hard mask film made of the composition for an organic hard mask film of claim 1 on the underlying layer;

(c) forming a second hard mask film on the organic hard mask film;

(d) forming a photoresist pattern on the resultant surface;

(e) patterning the second hard mask film using the photoresist pattern as an etching mask to form a second hard mask film pattern;

(f) patterning the first organic hard mask film using the second hard mask film pattern as an etching mask to form a double stack hard mask film pattern of the first organic hard mask film pattern and the second hard mask film pattern; and (e) patterning an underlying layer using the double stack hard mask film pattern as an etching mask to form an underlying pattern.

Step (b) preferably further includes the step of performing the baking process on the first organic hard mask film at a temperature ranging from 200° C. to 400° C. for 5 minutes to 10 minutes.

Step (c) preferably further includes the step of performing the baking step on the second hard mask film at a temperature ranging from 200° C. to 400° C. for 5 minutes to 10 minutes.

More specifically, the baking processes may be individually performed by two steps of (i) a first baking step of baking the composition at 200° C. to 400° C. for 2 minutes to 5 minutes; and (ii) a second baking step of baking the composition at 200° C. to 400° C. for 3 minutes to 5 minutes. The baking process may be a one-step process at 200° C. to 400° C. for 5 minutes to 10 minutes, but it is more effective when the above-described two-step baking process is performed.

Preferably, the first organic hard mask film has a thickness ranging from 200 to 700 nm, preferably 400 nm, and the second hard mask film has a thickness ranging from 30 nm to 100 nm with a SiON film.

Preferably, the etching process for the patterning is performed using a gas selected from the group consisting of $Cl_2$, Ar, $C_2F_6$, and mixtures thereof.

The method for forming the photoresist pattern of the step (d) preferably includes the steps of:

i) coating an antireflection film on the second hard mask film;

ii) forming the photoresist film on the antireflection film; and iii) patterning the resultant structure to form the stack pattern of the photoresist pattern and antireflection pattern.

The disclosed method for forming a pattern will be described in detail with reference to the attached drawings.

In addition, there is provided a semiconductor device manufactured by using the disclosed method for manufacturing semiconductor devices.

Figure 2A:
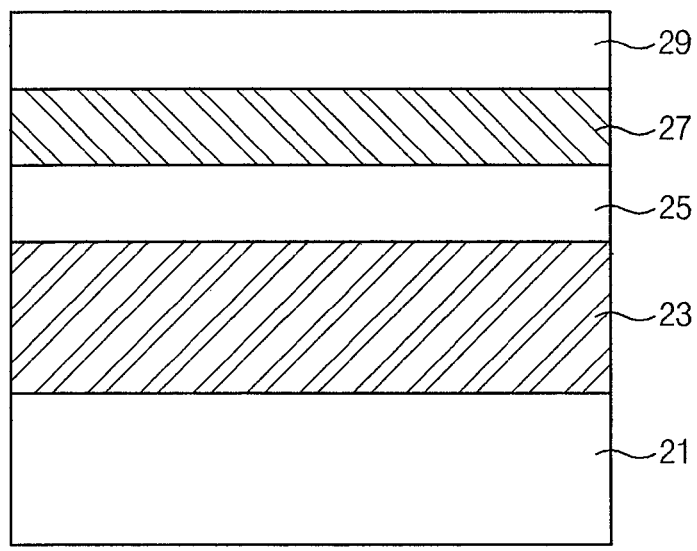
FIGS. 2a through 2d are cross-sectional diagrams illustrating a method for forming a pattern of a semiconductor device according to an embodiment of the disclosure.

Referring to FIG. 2a, a first organic hard mask film 23 using a disclosed composition for an organic hard mask film is formed on an underlying layer 21 and then a second hard mask film 25 with a SiON film is formed on the first organic hard mask film 23 to form a double hard mask film.

The first organic hard mask film is coated at a thickness of 400 nm with conventional photoresist film coating equipment, and then baked at 200° C. to 400° C. for 2 minutes to 5 minutes and at 200° C. to 400° C. for 3 minutes to 5 minutes.

The second hard mask film is formed at a thickness of 60 nm, and then baked under the same conditions as that of the first organic hard mask film to cure second hard mask film.

Figure 2B:
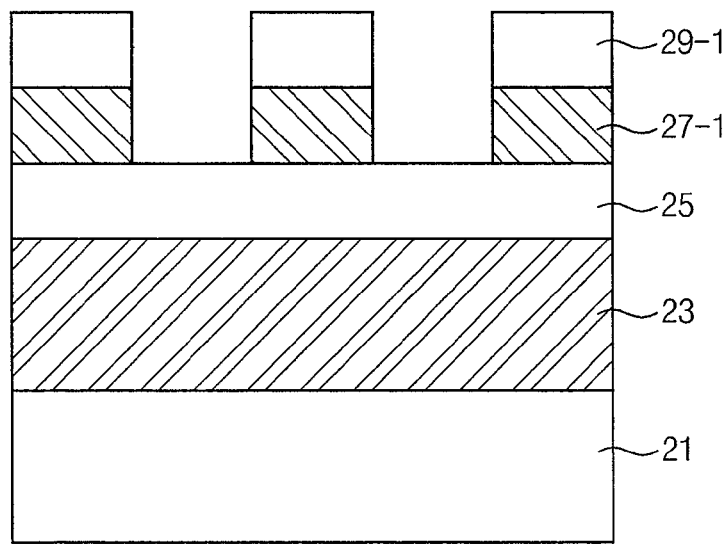

Thereafter, an antireflection film 27 and a photoresist film 29 are sequentially formed on the second hard mask film 25 to a stack film of the antireflection film 27 and the photoresist film 29, and then a lithography process is performed on the stack film to form the stack pattern of the antireflection film pattern 27-1 and photoresist pattern 29-1 as shown in FIG. 2b.

The etching process is performed on the second hard mask film 25 using the stack pattern as an etching mask until the first organic hard mask film 23 is exposed to form second hard mask film pattern 25-1.

Figure 2C:
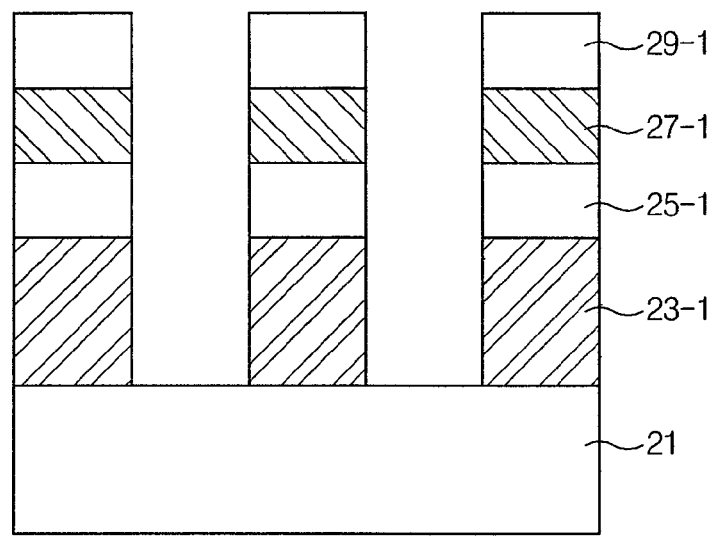

The etching process is performed on the first organic hard mask film 23 using the second hard mask film pattern 25-1 as an etching mask until the underlying layer 21 is exposed to form double stack hard mask pattern of first organic hard mask film pattern 23-1 and the second hard mask film pattern 25-1 as shown in FIG. 2c.

Figure 2D:
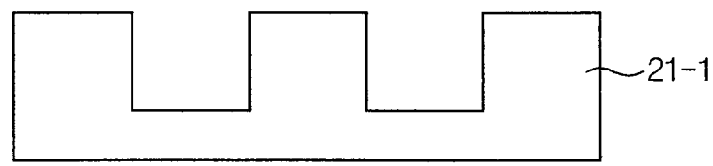

Then, the etching process is performed on the underlying layer 21 with the double stack hard mask pattern of FIG. 2c as an etching mask, and developed to form an underlying layer pattern 21-1 as shown in FIG. 2d.

The above etching processes are performed using a gas selected from the group consisting of $Cl_2$, Ar, $C_2F_6$, and mixtures thereof.

The disclosed compositions will be described in detail by referring to examples below, which are not intended to limit the present invention.

I. Preparation of a Disclosed Composition for an Organic Hard Mask

Preparation Example 1

A compound of Formula 2 (21.8 g) and a compound of Formula 3 (10.8 g) are dissolved in dimethylacetamide (230 g). The resulting mixture was stirred at room temperature for about 24 hours to obtain a composition including the polyamic acid compound (R=NH) of Formula 1. Then, a compound of Formula 5 (3 g) was added to the resulting mixture, and further stirred at room temperature for 24 hours to obtain a disclosed composition for the organic hard mask.

Preparation Example 2

The compound of Formula 2 (21.8 g) and the compound of Formula 4 (20 g) were dissolved in dimethylacetamide (290 g). The resulting mixture was stirred at room temperature for about 24 hours to obtain a composition including the polyamic acid compound

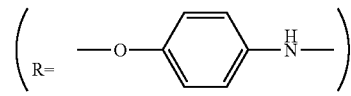

of Formula 1. Then, the compound of Formula 5 (3 g) was added to the resulting mixture, and further stirred at room temperature for 24 hours to obtain a disclosed composition for organic hard mask.

II. Formation of a Disclosed Pattern

Example 1

An underlying layer was deposited on a silicon wafer treated with HMDS, and the composition for organic hard mask of Preparation Example 1 was spin-coated thereon. The resulting structure was baked (i) at 200° C. for 5 minutes and then (ii) 400° C. for 5 minutes to form a first organic hard mask film. A SiON film as a second hard mask film was deposited at 60 nm on the first organic hard mask film, and then baked under the same baking condition as that of the first organic hard mask film.

An antireflection film (DAR202 produced by Dongjin Chemical Co.) and a photoresist film were sequentially formed on the second hard mask film to form stack film of the antireflection film and photoresist film, and then a lithography process was performed on the stack film with ArF to obtain a stack film pattern of the antireflection film and the photoresist pattern.

The first organic hard mask film and the second hard mask film were etched with the stack film pattern as an etching mask to form a double stack hard mask film pattern of the first organic hard mask film and the second hard mask film.

Figure 3:
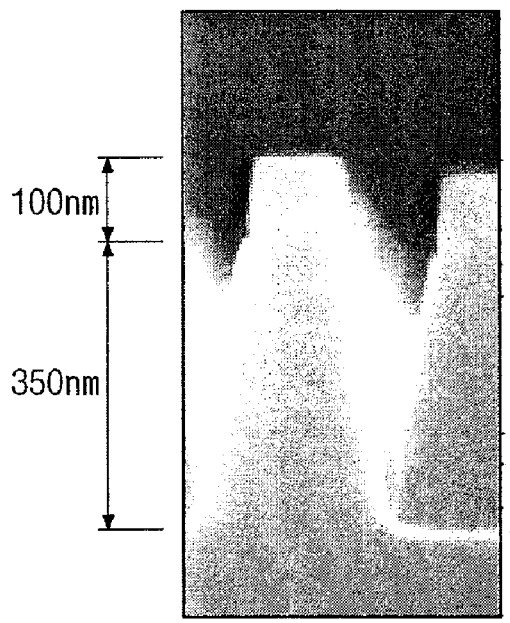
FIG. 3 is a photograph illustrating a photoresist pattern of Example 1.

The underlying layer was etched with double stack hard mask film pattern as an etching mask to form a underlying layer pattern of pitch 160 (see FIG. 3).

The etching process was performed by using a mixture gas of Cl2, Ar, and C2F6 as an etching mask.

Example 2

Figure 4:
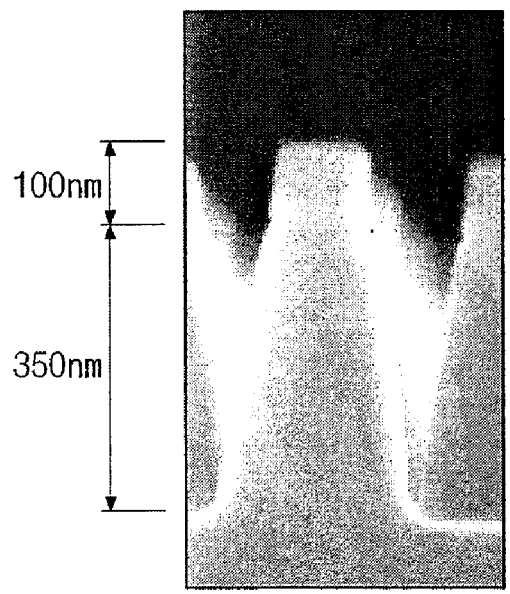
FIG. 4 is a photograph illustrating a photoresist pattern of Example 2.

The procedure of Example 1 was repeated using the composition for organic hard mask of Preparation Example 2 instead of the composition of Preparation Example 1 to obtain a pattern of pitch 160 (see FIG. 4).

As described above, a disclosed composition for the organic hard mask includes a polyamic acid compound and melamine derivative. An etching process was performed on a double hard mask film comprising a first organic hard mask film using the disclosed composition and a second hard mask film using SiON to obtain a uniform underlying layer pattern. In addition, new deposition equipment and material for forming hard mask are not required to form the first organic hard mask film, thereby reducing the process cost and number of process steps.

What is claimed is:

1. A method for forming a pattern of a semiconductor device, comprising:
   (a) forming an underlying layer on a semiconductor substrate;
   (b) forming a first organic hard mask film on the underlying layer, the first organic hard mask film consisting of:
      (i) a polyamic acid compound represented by Formula 1:

[Formula 1]

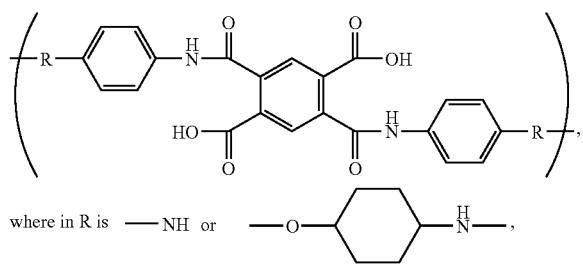

where in R is —NH— or 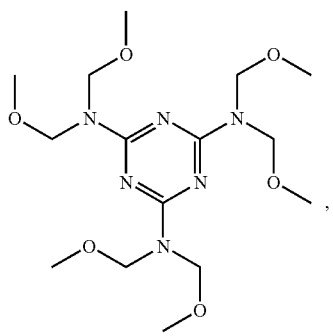

(ii) a melamine derivative represented by Formula 5:

[Formula 5]

and
   (iii) an organic solvent;
   (c) forming a second hard mask film on the first organic hard mask film, said second hard mask film defining a surface;
   (d) forming a photoresist pattern on the resultant surface of (c);
   (e) patterning the second hard mask film using the photoresist pattern as an etching mask to form a second hard mask film pattern;
   (f) patterning the first organic hard mask film using the second hard mask film pattern as an etching mask to form a double hard mask film pattern of the first organic hard mask film pattern and second hard mask film pattern; and
   (g) patterning an underlying layer using the double hard mask film pattern as an etching mask to form an underlying pattern.

2. The method of claim 1, wherein step (b) comprises performing a baking process on the first organic hard mask film at a temperature ranging from 200° C. to 400° C. for 5 minutes to 10 minutes.

3. The method of claim 1, wherein step (c) comprises performing the baking process on the second hard mask film at a temperature ranging from 200° C. to 400° C. for 5 minutes to 10 minutes.

4. The method of claim 2, comprising performing baking processes by two steps comprising a first baking step of baking the composition at 200° C. to 400° C. for 2 minutes to 5 minutes; and a second baking step of baking the composition at 200° C. to 400° C. for 3 minutes to 5 minutes.

5. The method of claim 1, comprising forming the first organic hard mask film by a thickness of 200 nm to 700 nm.

6. The method of claim 1, wherein the second hard mask film is a SiON film.

7. The method of claim 1, comprising forming the second hard mask film by a thickness of 30 nm to 100 nm.

8. The method of claim 1, comprising forming the photoresist pattern of the step (d) by
   i) coating an antireflection film on the second hard mask film;
   ii) forming the photoresist film on the antireflection film; and
   iii) patterning the resultant structure to form a stack pattern of the photoresist pattern and antireflection pattern.

9. The method of claim 1, comprising performing the patterning step by an etching process using a gas selected from the group consisting of $Cl_2$, Ar, $C_2F_6$, and mixtures thereof.

10. The semiconductor device manufactured by the method of claim 1.

* * * * *